United States Patent [19]

Jokinen et al.

[11] Patent Number: 5,153,468
[45] Date of Patent: Oct. 6, 1992

[54] METHOD AND A CIRCUIT FOR REDUCING MICROPHONY

[75] Inventors: Tauno Jokinen; Markku Vimpari, both of Oulu, Finland

[73] Assignee: Nokia Mobile Phones Ltd., Salo, Finland

[21] Appl. No.: 676,199

[22] Filed: Mar. 27, 1991

[30] Foreign Application Priority Data

Mar. 29, 1990 [FI] Finland .................................. 901583

[51] Int. Cl.⁵ .............................................. H03B 1/00
[52] U.S. Cl. .................................. 307/520; 307/521; 328/167
[58] Field of Search ................ 307/520, 521; 328/167; 331/17

[56] References Cited

U.S. PATENT DOCUMENTS

| | | | |
|---|---|---|---|
| 4,000,414 | 12/1976 | Hansen | 307/520 |
| 4,943,736 | 7/1990 | Kihara et al. | 307/520 |
| 4,994,774 | 2/1991 | Joosse | 307/520 |

FOREIGN PATENT DOCUMENTS 2734112  8/1979  Fed. Rep. of Germany ...... 307/520

*Primary Examiner*—Eugene R. Laroche
*Assistant Examiner*—Tan Dinh
*Attorney, Agent, or Firm*—Darby & Darby

[57] ABSTRACT

By the method according to the invention, microphony, i.e. interference voltages caused by vibration, in a circuit including ceramic surface-mounted capacitors is reduced by eliminating the direct-voltage differential (V1 - V2) effective across the capacitors (C30 - C36). The invention also relates to circuit arrangements implementing the method, and it can be advantageously applied to a radio telephone.

7 Claims, 5 Drawing Sheets

METHOD AND A CIRCUIT FOR REDUCING MICROPHONY

BACKGROUND OF THE INVENTION

The present invention relates to a method and circuit for reducing microphony in a circuit having ceramic surface-mounted capacitors.

In recent years, the use of surface-mounted components in electronic circuits has become more common. Although the surface mounting construction has advantages, the ceramic surface-mounted capacitors are subject to interference voltages caused by microphony. Such microphony is especially detrimental in filter circuits of radio telephones and in voltage-controlled oscillator.

Microphony of a ceramic capacitor means that the voltage between the capacitor terminals changes under mechanical action. Such as impacts or vibration, which cause the capacitor to deform. Portable and car mounted radio telephones are susceptible to this phenomenon. Attempts have been made to reduce microphony by locating the critical capacitors they are the most firmly fastened, i.e., where their deformation is minimal. Special attention must also be paid fastening the surface-mounted capacitor to the printed circuit board.

This approach produces problems in circuit design because ti substantially restricts the components' location and/or increases the costs of mechanical installations.

SUMMARY OF THE INVENTION

The object of the present invention is to solve the problem of the microphony of in ceramic surface-mounted capacitors. A method and circuit are disclosed which solve the microphony problem by eliminating the direct voltage differential across the capacitors. If the direct voltage effective across the capacitor is eliminated, microphony does not cause non-desirable interference voltage. Embodiments of the invention are presented in the non-independent claims.

BRIEF DESCRIPTION OF THE DRAWINGS

The invention is described below using an of embodiment of a loop filter of the frequency synthesizer of a radio telephone, with reference to the accompanying drawings, in which.

DETAILED DESCRIPTION OF PREFERRED EMBODIMENTS

Figure 1:
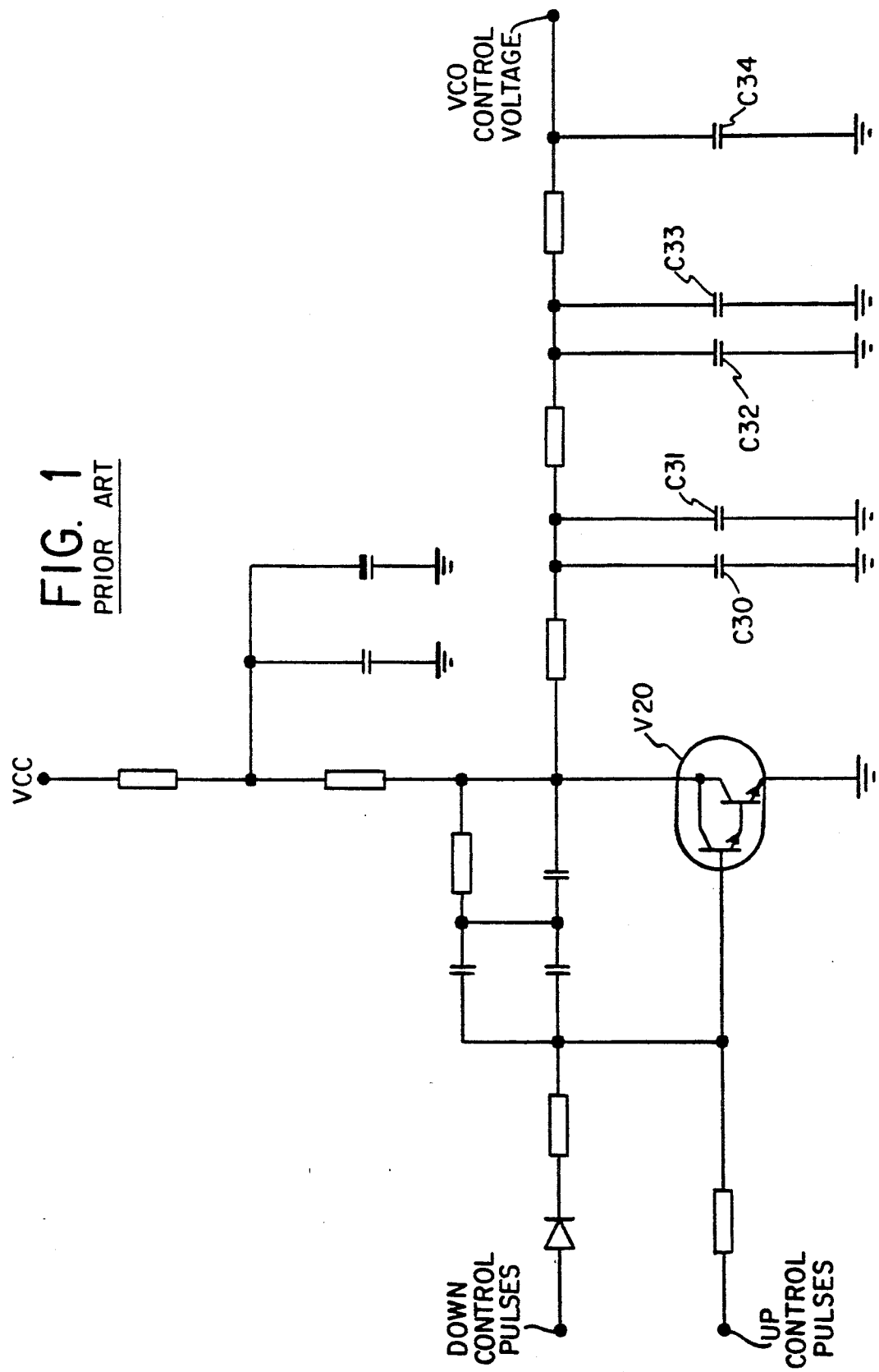
FIG. 1 is the circuit diagram of one prior-art frequency synthesizer.

In a typical phase-locked frequency synthesizer, the loop filer is coupled between the phase comparator and the VCO. FIG. 1 shows a second-degree active filter where the operating parameters of the loop are determined at the frequency and time levels (e.g., settling time, modulation response). The loop filter functions within the audio frequency range, the typical cut-off frequency of the low-pass stage being approximately 200 Hz. With practical component values, this usually requires to the use of components on an order of magnitude of 10-47 nF. Surface mounted ceramic components of this magnitude are quite microphonic. Passive-stage capacitors connected after the active loop filter are particularly prone to develop microphony, since even an interference voltage of 1 mV in the VCO control one corresponds to the highest possible speech volume of a mobile telephones modulated transmission signal.

FIG. 1 depicts the circuit diagram of the loop filter of the frequency synthesizer used in a radio telephone. This circuit has been implemented using surface-mounted components. In the loop filter, the ceramic surface-mounted capacitors C30-C33 (22 nF) to the right of the transistor pair V20 are coupled between the signal lead and ground. When the circuit board is subjected to an impact, microphony of the capacitors produces an interference voltage having a strongly varying amplitude.

The invention is based on an ideal/model of the production of non-desirable, interference voltages: when a capacitor is bent mechanically, its capacitance value changes. Although the capacitance of the bent capacitor changes, the electric charge (i.e., the number of electrons present) does not change. Thus, there is a resultant change in the voltage proportional to the change in capacitance.

The interference voltage is due to the change in the capacitance value can be expressed roughly by the formula:

$$\text{interference voltage} = (\text{change in capacitance}) \times (\text{voltage effective across the capacitor})$$

From this it is observed that the generation of an interference voltage can be substantially avoided by eliminating the voltage (direct voltage) effective across the capacitor. In other words, if the voltage across the capacitor approaches zero, the interference voltage will also approach zero.

In order to test this ideal model, an experiment was performed comparing two surface-mounted capacitors in a circuit on a printed circuit board. One of them was coupled in the prior art manner shown in FIG. 1, so that there was a direct voltage effective across it. The voltage changes of the capacitor were strongly amplified, and the amplified signal was measured in one of the channels of a memory oscilloscope. The other channel was coupled to a capacitor across which there was no direct-voltage component, in accordance with the present. By striking the printed circuit board, an easily detectable impact response was obtained.

Figure 2:
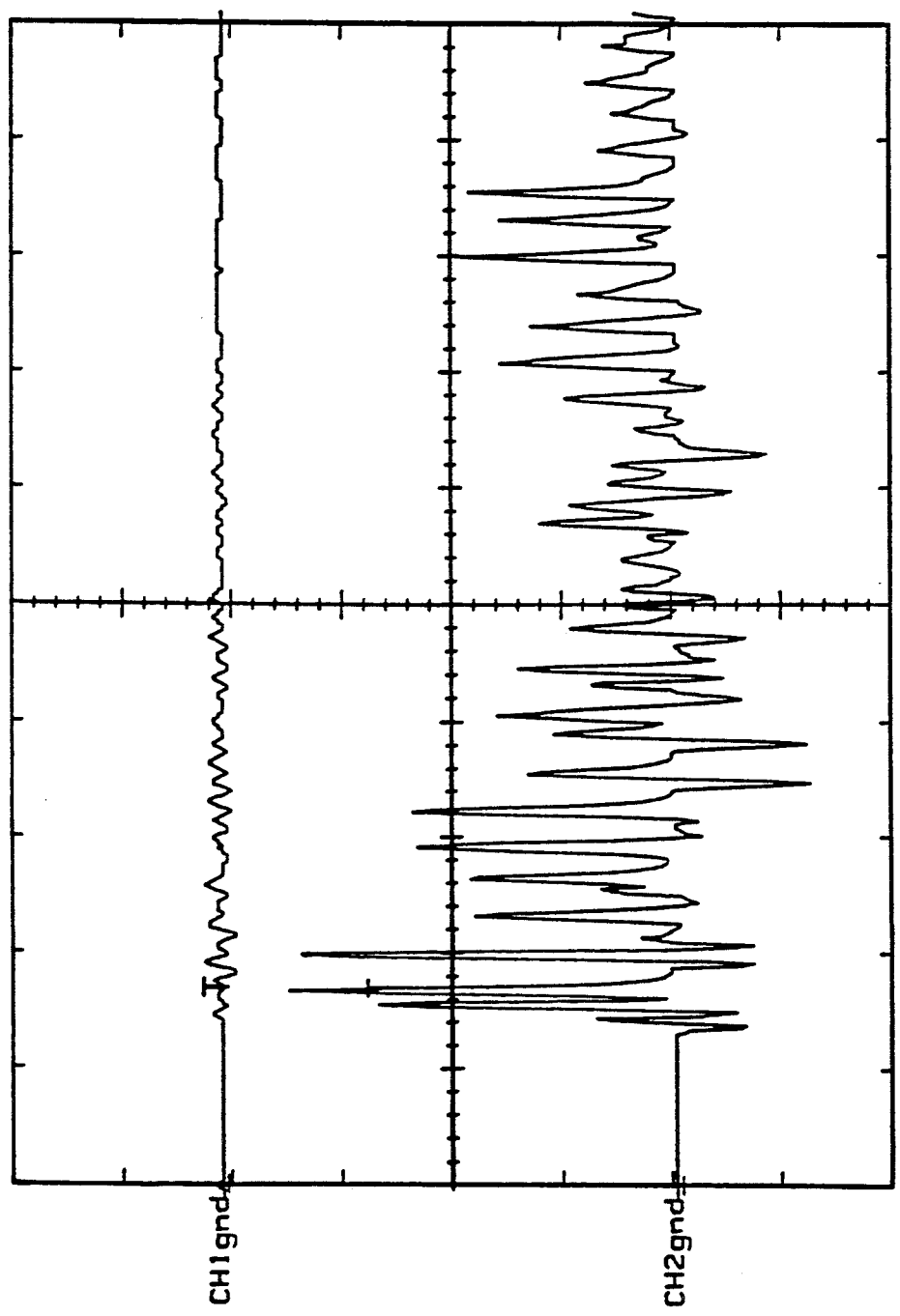
FIG. 2 is a representation of an oscilloscope display, depicting a comparison of the interference voltages in an impact test with a capacitor having conventional circuitry and a capacitor having circuitry according to the invention and no direct-voltage component across the capacitor.
Figure 3:
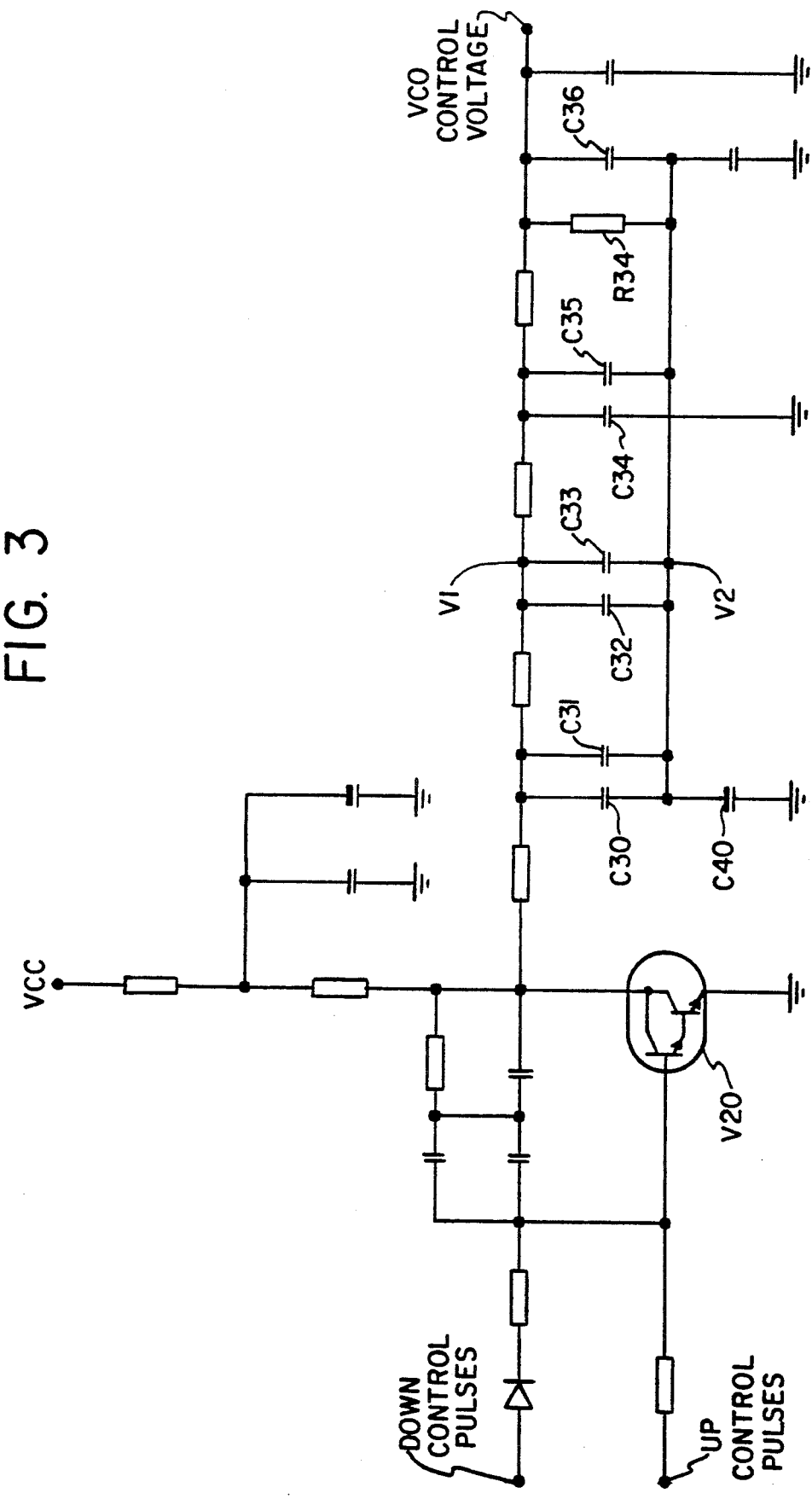
FIGS. 3-5 depict circuits according to the invention, fitted in a loop filter of a synthesizer according to FIG. 1.

FIG. 2 depicts an oscillogram showing the strong impact response (oscillation of the voltage) of the capacitor. Channel 2 (indicated by CGH2 gnd) has the interference voltage caused by the capacitor coupled acceding to the prior art principle of FIG. 1, and channel 1 (indicated by CH1 gnd) has the interference voltage caused by the ceramic piece capacitor (e.g. C30) which is coupled according of the principle of the present invention, (which is shown in FIG. 3 and described below), i.e., it is compensated. In both cases the oscilloscope settings and test coupling amplifications were identical. Thus the effect of the invention was verified, i.e., the reduction of the interference voltage, even to the extent that the arrangement according to the ivention can be deemed to substantially prevent the production of an interference voltage due to capacitor microphony.

At the same time it was observed that the tantalum capacitor used in the experiment did not, upon impact, cause an interference voltage typical of a ceramic capacitor.

The method according of the present invention can be implemented by arranging a circuit which eliminates the direct voltage effective across ceramic capacitors. The loop filter circuit of FIG. 1 is used as an example. As the first step the signal ground of the capacitors was are separated from the actual ground potential by a tantalum capacitor. FIG. 3 depicts a circuit like this, having a tantalum capacitor C40 (1 μF).

Figure 4:
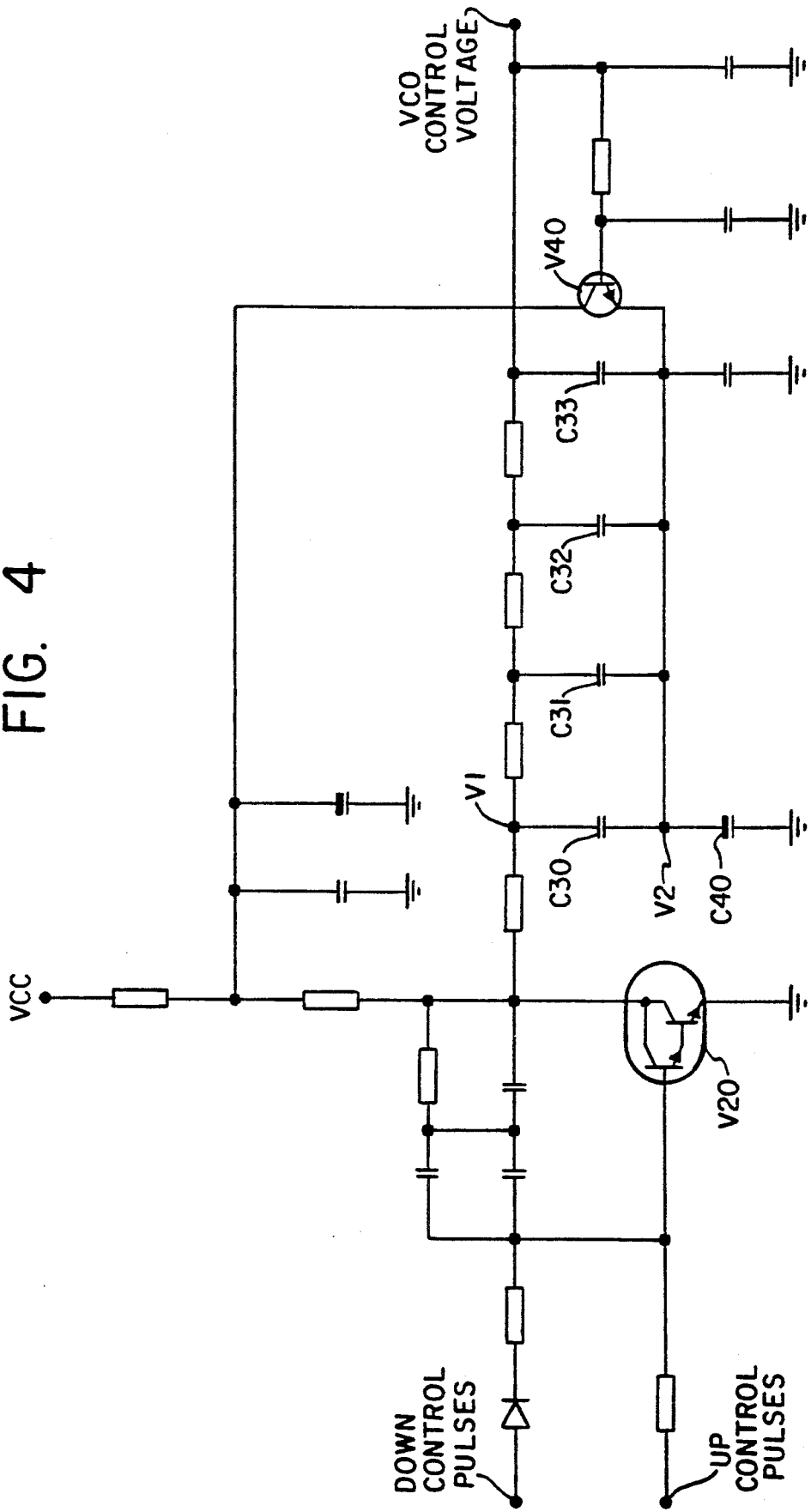
Figure 5:
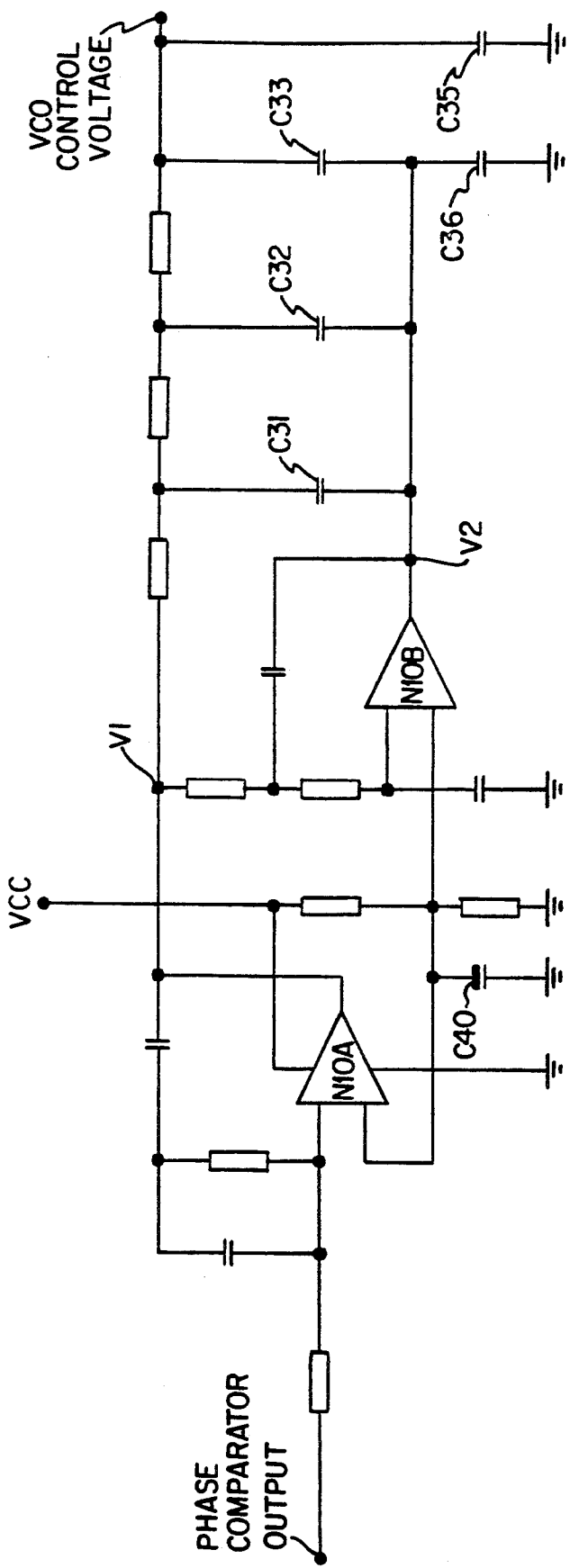

In FIGS. 3–5 the direct voltage of the signal lead is indicated by V1 and the and direct voltage potential of the signal ground by V2.

In the loop filter of FIG. 3, microphony may appear on the ceramic capacitors C30–C36 (22 nF). The direct voltage differential effective across them is elevated by means of a resistance R34 (100 kohm) in parallel connection with these capacitors. This resistance eliminates the DC voltage across the ceramic capacitors so that V1=V2.

In the loop filter of FIG. 4, there are ceramic capacitors C30–C33 (values 33 nF, 10 nF) and also a tantalum capacitor C40 (1 μF). In this circuit, the direct-voltage differential V1–V2 is eliminated by means of a transistor V40 whose base and emitter are in parallel connection with these capacitors.

FIG. 5 depicts a loop filter using operational amplifiers. The operational amplifiers N10A and N10B are coupled in such a manner that they actively cancel any possible direct-voltage differential V1–V2. In other words, the operational amplifiers N10A and N10B are arranged to provide substantially equal potentials to each side of the capacitors. The apparent ground potential is formed by a tantalum capacitor C40 (10 μF).

A comparison of FIGS. 3–5 to the loop filer according to FIG. 1 shows that they have certain additional components due to practical circuit design. The components essential from the viewpoint of the invention were mentioned above in connection with the figures. It is hardly necessary to describe the operation of the circuits of FIGS. 1, and 3–5 in greater detail in this context, because it is evident to an expert in the art and does not as such relate to the application of the invention. The method according of the invention can be implemented in a plurality of other ways which may occur to an expert in the art upon reading this specification.

In the experiments carried out, it was observed that by using the circuit arrangement according to the invention, the interference voltage caused by a ceramic surface-mounted capacitor can be reduced in a precisely predictable manner by 20–40 dB, in which case the elimination of the direct voltage from the ceramic capacitor means that such a capacitor will not be a factor affecting the total microphony of a radio telephone.

The described loop filter of a frequency synthesizer is only one example of the circuits in which the method according to the invention can be applied for reducing microphony.

We claim:

1. A circuit for educing microphony in a filter circuit having ceramic surface-mounted capacitors, each capacitor having two terminals, comprising:
   a signal lead connected to one terminal of each capacitor;
   a signal reference level connected to the other terminal of each capacitor; and
   circuit component means connected to the capacitors for eliminating d.c. potential differences between the signal lead and signal reference level.

2. The circuit of claim 1, wherein the circuit component means includes a resistor in parallel connection with the capacitor.

3. The circuit of claim 11, wherein the circuit component means includes a transistor coupled as a high-impedance component between the signal lead and the signal reference level.

4. The circuit of claim 1, wherein the circuit component means includes at least one operational amplifier which adjusts the direct-voltage potential of the signal lead to the direct voltage of the signal reference level.

5. The circuit of claim 1, wherein the circuit is used in a portable data communication apparatus.

6. The circuit of claim 5, wherein the data communication circuit is a radio telephone.

7. The circuit of claim 1, wherein the circuit is a filter located between a voltage controlled oscillator and a phase comparator of a phase-locked loop.

* * * * *